(12) United States Patent
Kaps et al.

(10) Patent No.: US 7,232,973 B2
(45) Date of Patent: Jun. 19, 2007

(54) CAPACITIVE TOUCH SWITCH

(75) Inventors: Werner Kaps, Weiler-Simmerberg (DE); Uwe Heimann, Nürnberg (DE)

(73) Assignee: Diehl AKO Stiftung & Co. KG, Nuernberg (DE)

( * ) Notice: Subject to any disclaimer, the term of this patent is extended or adjusted under 35 U.S.C. 154(b) by 0 days.

(21) Appl. No.: 11/311,775

(22) Filed: Dec. 19, 2005

(65) Prior Publication Data

US 2006/0131159 A1    Jun. 22, 2006

(30) Foreign Application Priority Data

Dec. 17, 2004   (DE)   .................... 10 2004 060 846

(51) Int. Cl.
*H03K 17/975*   (2006.01)

(52) U.S. Cl. ..................................... 200/600

(58) Field of Classification Search ................ 200/600, 200/310, 314, 317, 511, 512; 341/33, 20, 341/22, 34; 345/173, 156, 168, 169; 379/368, 379/433.07

See application file for complete search history.

(56) References Cited

U.S. PATENT DOCUMENTS

| | | | |
|---|---|---|---|
| 4,261,042 A * | 4/1981 | Ishiwatari et al. .......... 200/5 A |
| 4,296,406 A * | 10/1981 | Pearson ........................ 341/34 |
| 4,308,439 A * | 12/1981 | Itoh ............................ 200/511 |
| 4,380,007 A | 4/1983 | Steinegger |
| 4,731,694 A * | 3/1988 | Grabner et al. ............... 341/33 |
| 5,280,145 A * | 1/1994 | Mosier et al. .............. 200/313 |
| 5,917,165 A | 6/1999 | Platt et al. |
| 5,942,733 A * | 8/1999 | Allen et al. ............. 178/18.01 |
| 5,973,417 A | 10/1999 | Goetz et al. |
| 6,006,386 A * | 12/1999 | Mohaupt .................. 73/862.68 |
| 6,667,563 B2 * | 12/2003 | Bae et al. .................... 200/600 |
| 6,723,937 B2 * | 4/2004 | Englemann et al. ........ 200/600 |
| 6,755,561 B2 * | 6/2004 | Kluser ........................ 362/551 |
| 6,831,241 B2 * | 12/2004 | Fukui et al. ................ 200/512 |
| 6,841,748 B2 * | 1/2005 | Serizawa et al. ........... 200/512 |
| 6,968,746 B2 * | 11/2005 | Shank et al. .................. 73/780 |
| 2002/0112942 A1 | 8/2002 | Galmiche et al. |
| 2002/0167704 A1 | 11/2002 | Kleinhans et al. |
| 2005/0248544 A1 | 11/2005 | Adam et al. |

FOREIGN PATENT DOCUMENTS

EP    0 859 467 B1    4/1998

* cited by examiner

*Primary Examiner*—Michael A. Friedhofer
(74) *Attorney, Agent, or Firm*—Laurence A. Greenberg; Werner H. Stemer; Ralph E. Locher

(57) ABSTRACT

A capacitive touch switch includes a sensor button which is disposed between a circuit board and a cover plate and which forms a terminal of a capacitor that is variable in its capacitance by an approach. The sensor button includes a body of a flexible material, which body can be adapted to the cover plate and is embraced by a conductive net.

17 Claims, 4 Drawing Sheets

CAPACITIVE TOUCH SWITCH

BACKGROUND OF THE INVENTION FIELD OF THE INVENTION

The invention concerns a capacitive touch switch with a flexible body, in particular formed of foam, arranged between a circuit board and a cover plate. A touch switch of this kind is known for example from European patent EP 0 859 467 B1, corresponding to U.S. Pat. No. 5,917,165.

The touch switch known from European patent EP 0 859 467 B1 contains a flexible body which is disposed on a metallic contact surface of a circuit board and bridges over the space between the circuit board and a cover plate. To produce electrical conductivity of the body, in particular a foam body, for example carbon is incorporated into same. A high level of electrical resistance of the foam body of for example 500 kiloohms is intended to contribute to good electromagnetic compatibility (EMC), in particular a filter action in relation to electrical interferences.

SUMMARY OF THE INVENTION

It is accordingly an object of the invention to provide a capacitive touch switch that overcomes the above-mentioned disadvantages of the prior art devices of this general type, which is distinguished by a particularly advantageous combination of mechanical and electrical properties.

With the foregoing and other objects in view there is provided, in accordance with the invention, a capacitive touch switch. The switch contains a circuit board, a cover plate, and a sensor button disposed between the circuit board and the cover plate. The sensor button forms a terminal of a capacitor that is variable in its capacitance when touched. The sensor button has an electrically conductive layer and a body of a flexible material being adapted to the cover plate. The body is electrically non-conductive and at least partially enclosed by the electrically conductive layer.

The touch switch includes a flexible body which forms a part of a sensor button and which is disposed between a circuit board and a cover plate. In accordance with the invention the body is encompassed by a conductive net. In that way the electrical properties of the body are substantially improved, without adversely affecting the mechanical properties. In particular the contact resistance between the sensor button and a contact surface on the adjoining circuit board is reduced.

The body which is flexible in itself, in particular the foam body, of the sensor button is preferably an electrical insulator. For example, a soft-elastic plastic material, natural rubber, synthetic rubber, silicone or any other soft, in particular foamable material is suitable as the material for producing the elastic body. In any event the specific electrical conductivity of the body is less than that of the net laid around the body. The body can be of widely differing geometrical shapes, for example a cylindrical shape. In a preferred configuration the body is in the form of a cuboid, in particular of a square cross-sectional area. The conductive net is pulled like a tube over the body or laid like a cloth around the body so that it covers it, in the case of a cuboidal shape, on four sides. In any event both the side of the body that is towards the circuit board and also the side of the body that is towards the cover plate is covered by the conductive net.

The conductive net can comprise for example a metal braid. The term "net" is to be interpreted in a very broad sense and also includes for example a non-woven or fleece material as well as a wire winding. Preferably the net is formed from a cloth of a non-conductor, for example nylon or another synthetic fiber, which cloth is metallized, that is to say provided with a metallic covering. The conductive net has practically no effects on the mechanical properties of the elastic body.

In accordance with a preferred embodiment at least one light device, in particular a light emitting diode, is disposed on the circuit board. In order to light up the sensor button or a region of the cover plate, which adjoins the sensor button, the light emitted by the light device can be passed through an opening in the body. In that respect, it is of particular advantage for a light guide to be disposed in the opening of the flexible body. Preferably the light guide is made from an elastically yielding material, in particular silicone, in order to be able to adapt to the shape of the flexible body.

In accordance with an advantageous development, in a plan view on to the circuit board, the at least one sensor button on the circuit board is embedded in a mat of elastic material, in particular a silicone mat. In that way the sensor button is surrounded by the elastic material on all sides, with the exception of those sides that are towards the circuit board or the cover plate. On the one hand, the function of the mat is to hold the sensor button or sensor buttons at the intended position on the circuit board and thus facilitate very rational assembly. On the other hand the mat also has a sealing function, in which respect the external contours of the mat preferably at least approximately correspond to the contours of the circuit board and the cover plate. In addition the mat can also serve as a light-conducting element. In particular it is possible for the light emitted by a light device disposed on the circuit board to be guided through the mat. The light guide referred to hereinbefore in connection with a light emitting diode can therefore be provided in one piece with the mat that encloses the sensor button. Alternatively it is also possible for separate light guides to be fitted in openings in the mat.

The cover plate that is preferably made from plastic material is disposed substantially parallel to the circuit board. A particularly ergonomic configuration can be achieved in many situations of use if the cover plate has an at least slight curvature. The spacing between the cover plate and the circuit board is thus not the same at all locations. The flexible body that is enclosed with a conductive net is adapted to the varying spacings between the cover plate and the circuit board. If necessary sensor buttons of different dimensions can also be mounted on a single circuit board.

The sensor button forms a terminal of a capacitor that can be varied in respect of its capacitance by a finger of an operator being applied to the cover plate. The electrical properties of the capacitor can be specifically and targetedly influenced by the surface of the cover plate, which is towards the circuit board, being conductively coated. In particular a metallic coating on a plastic film can be considered as the conductive layer that is in electrical contact with the net embracing the body. In accordance with an alternative configuration a conductive layer, in particular a metallized film, is disposed on the outer surface of the cover plate, that is to say the surface which is remote from the circuit board.

Other features which are considered as characteristic for the invention are set forth in the appended claims.

Although the invention is illustrated and described herein as embodied in a capacitive touch switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
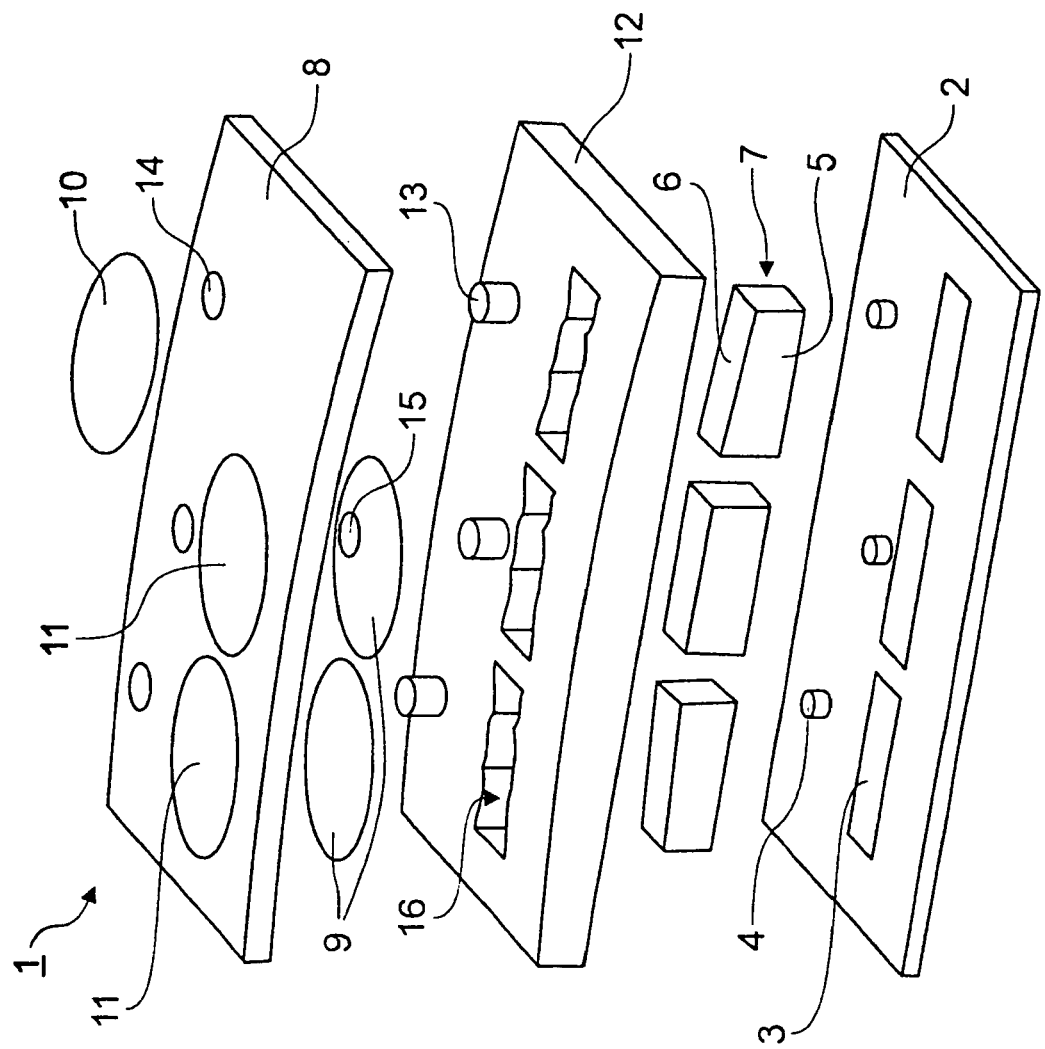
FIG. 1A is a diagrammatic, exploded perspective view of a first embodiment of a capacitive touch switch according to the invention.

In all the figures of the drawing, sub-features and integral parts that correspond to one another bear the same reference symbol in each case. Referring now to the figures of the drawing in detail and first, particularly, to FIG. 1A thereof, there is shown a capacitive touch switch 1. The capacitive touch switch 1 has a printed circuit arrangement or circuit board 2 having a plurality of rectangular contact surfaces 3 and non-illustrated conductor tracks. Also disposed on the circuit board 2 are a plurality of light emitting diodes 4, generally identified as light devices. The contact surfaces 3 are each contacted by a respective sensor button 5 that is formed from a cuboidal body 7 of a foam material, embraced by a conductive net 6. Each sensor button 5 is thus of a flexible, elastically yielding configuration and in the assembled condition of the touch switch 1 is at least slightly compressed in order at any event to completely fill up the available installation space.

Figure 1B:
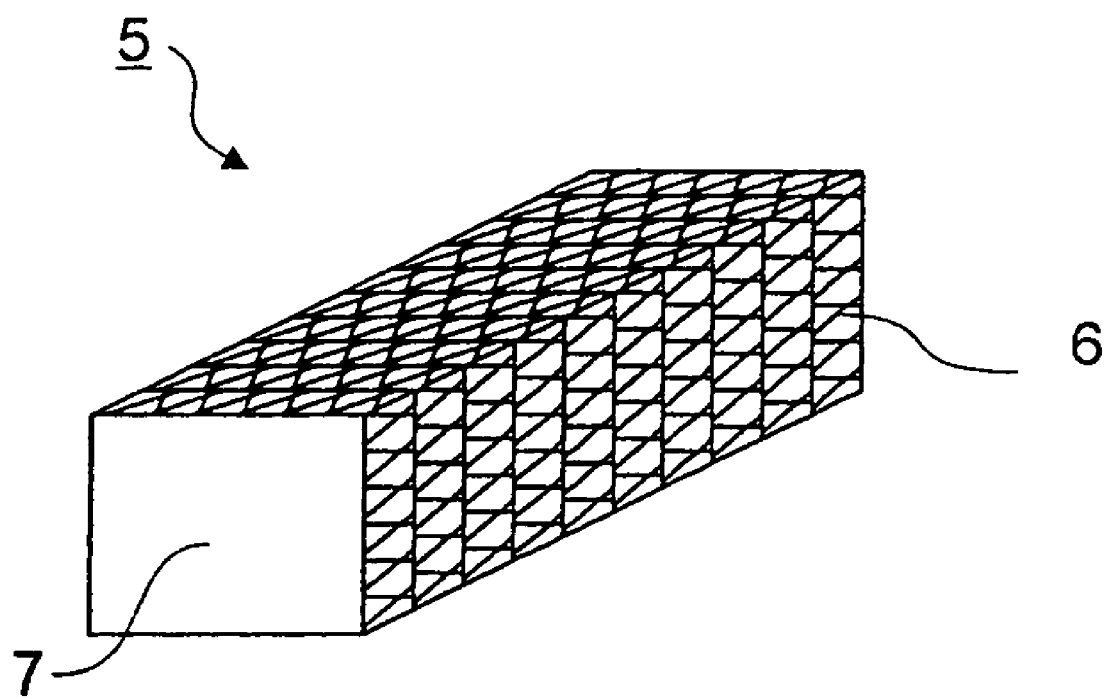
FIG. 1B is a perspective view of a sensor button of the touch switch shown in FIG. 1A.
Figure 2:
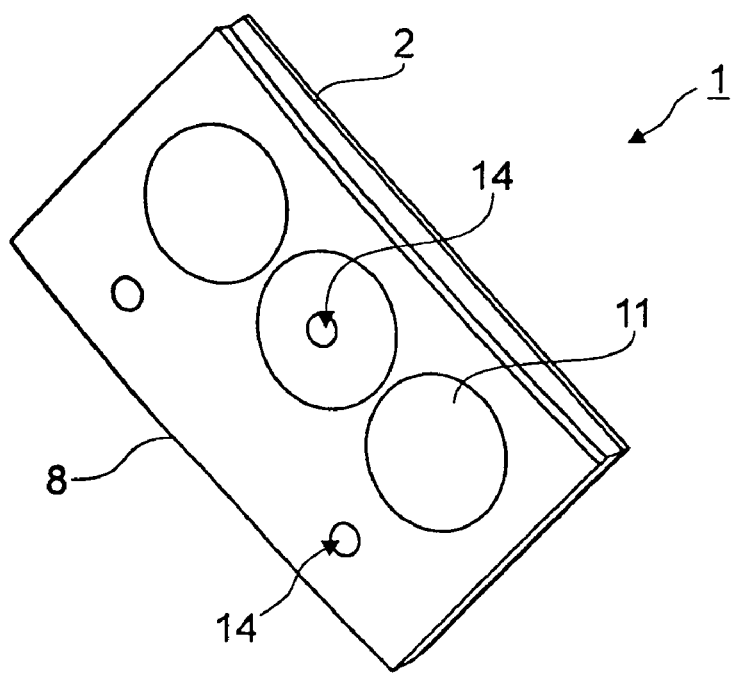
FIG. 2A is a diagrammatic, perspective view of a second embodiment of the capacitive touch switch.
FIGS. 2B–2C are sectional views of the second embodiment of the capacitive touch switch.
FIG. 2D is a plan view of the second embodiment of the capacitive touch switch.
FIGS. 2E–2F are sectional views of the second embodiment of the capacitive touch switch.
Figure 2:
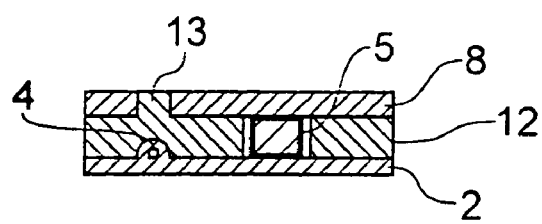
Figure 2:
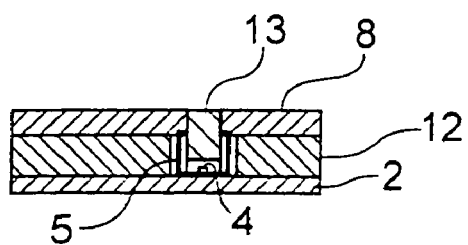
Figure 2:
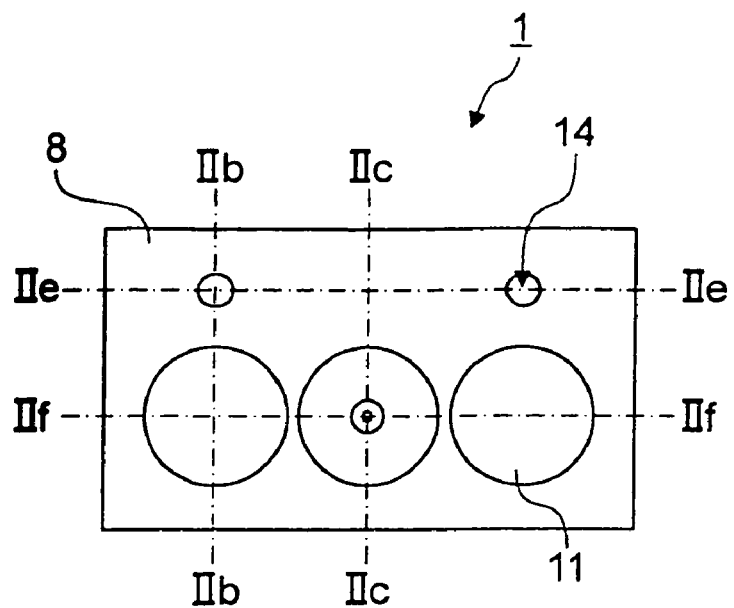
Figure 2:
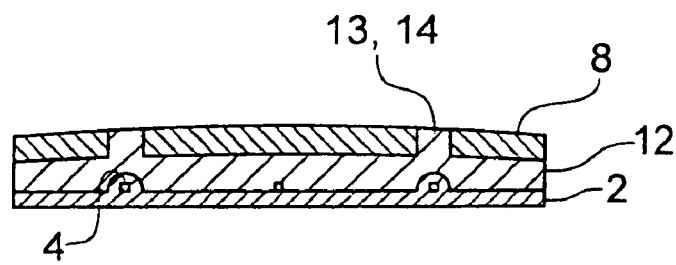
Figure 2:
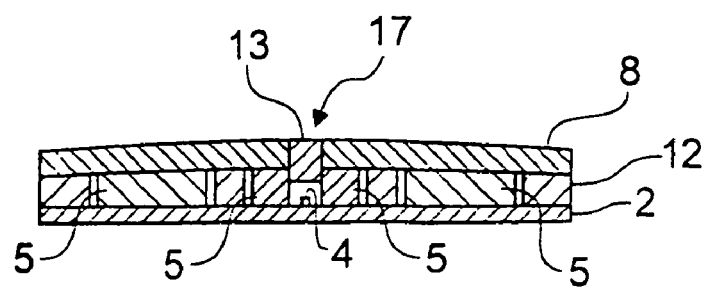

The configuration of the sensor button 5 can be seen in detail from FIG. 1B. The net 6 is in the form of a tube that is laid around the body 7 and is made from metallically coated synthetic material fibers, namely nylon fibers. The compressibility of the body 7 that is made from an insulating material is practically uninfluenced by the net 6. Disposed on the top sides of the sensor buttons 5, which top sides are in substantially parallel spaced relationship from the contact surfaces 3, is a slightly curved cover plate 8 which is made from plastic material and which functions as an operating panel. Disposed at the surface of the cover plate 8, which is towards the circuit board 2, are two circular metallized films 9 which respectively contact the sensor button 5. The configuration formed of the conductive film 9, the sensor button 5 and the contact surface 3 overall form a terminal of a capacitor. In accordance with an alternative configuration, a metallized film 10 is disposed on the top side, that is to say the side of the cover plate 8, which is remote from the circuit board 2. If there is no metallized film on the top side of the cover plate 8, it is provided with an ink or color print 11, the surface of which corresponds to the surface of the metallized film 9. The touch switch however can also be configured entirely without the metallized films 9, 10.

The space between the circuit board 2 and the cover plate 8 is substantially filled with a mat 12 of silicone, which has a sealing and at the same time light-guiding function. The latter function is particularly apparent on the basis of light guide cylinders 13 which project out of the otherwise substantially flat surface of the mat 12, and fill round openings 14 in the cover plate 8. If the light emitting diode 4, in plan view on to the cover plate 8, is disposed in the region of the film 9 and the print 11, as in the case of the central sensor button 5, the film 9 also has an opening 15 adapted to the shape of the light guide cylinder 13. The sensor buttons 5 are disposed in apertures 16 in the mat 12, which are substantially of a rectangular cross-sectional shape. As a departure from an exact rectangular shape however the contours of the apertures 16 are corrugated somewhat in order to permit easier assembly, even in the event of slight deviations from the geometrical reference values.

The embodiment shown in FIGS. 2A to 2F differs from the embodiment of FIG. 1 primarily by the configuration of the light emitting diodes 4. The central one of the light emitting diodes 4 is disposed on the circuit board 2 at a location at which the central sensor button 5 also rests on the circuit board 2. That sensor button 5 therefore has a cylindrical opening 17 whose cross-section corresponds to the cross-section of the light guide cylinder 13. In that way it is possible for the light emitting diode 4 to be disposed in centered relationship relative to the conductive film 9 and the sensor button 5.

This application claims the priority, under 35 U.S.C. § 119, of German patent application No. 10 2004 060 846.6, filed Dec. 17, 2004; the entire disclosure of the prior application is herewith incorporated by reference.

We claim:

1. A capacitive touch switch, comprising:
   a circuit board;
   a cover plate; and
   a sensor button disposed between said circuit board and said cover plate and forming a terminal of a capacitor being variable in capacitance upon a user approaching said cover plate, said sensor button having an electrically conductive layer and a body, said body being formed of a flexible material and said body being adapted to said cover plate, said body being electrically non-conductive and at least partially enclosed by said electrically conductive layer.

2. The touch switch according to claim 1, wherein said conductive layer is a conductive net encompassing said body.

3. The touch switch according to claim 2, wherein said conductive net is a metallized woven non-conductor material.

4. The touch switch according to claim 1, further comprising a light device disposed on said circuit board.

5. The touch switch according to claim 4, wherein said light device is a light emitting diode.

6. The touch switch according to claim 4, wherein said body has an opening formed therein through which passes light emitted by said light device.

7. The touch switch according to claim 6, further comprising a light guide disposed in said opening.

8. The touch switch according to claim 7, wherein said light guide is formed from an elastically yielding material.

9. The touch switch according to claim 8, wherein said elastically yielding material is silicone.

10. The touch switch according to claim 4, wherein said sensor button has sides, which are not facing towards said circuit board or said cover plate; and
   further comprising a mat formed of an elastic material covering said sides.

11. The touch switch according to claim 10, wherein said elastic mat is a light-guide for guiding light emitted by said light device on said circuit board.

12. The touch switch according to claim 10, wherein said elastic material is silicone.

13. The touch switch according to claim 1, wherein said cover plate is curved.

14. The touch switch according to claim 1, further comprising a conductive layer disposed on a surface of said cover plate.

15. The touch switch according to claim 1, further comprising a conductive layer disposed between said body and said cover plate.

16. The touch switch according to claim 1, wherein the capacitance is variable without the user applying pressure.

17. The touch switch according to claim 1, wherein the capacitance is variable without the user compressing said sensor button.

* * * * *